US012761551B2

(12) United States Patent
Moon et al.

(10) Patent No.: US 12,761,551 B2
(45) Date of Patent: Oct. 13, 2026

(54) METHOD OF FORMING PATTERNS

(71) Applicants: Samsung SDI Co., Ltd., Yongin-si (KR); SAMSUNG ELECTRONICS CO., LTD., Suwon-si (KR)

(72) Inventors: Hyungrang Moon, Suwon-si (KR); Youngkwon Kim, Suwon-si (KR); Ryunmin Heo, Suwon-si (KR); Minyoung Lee, Suwon-si (KR); Minsoo Kim, Suwon-si (KR); Kyuwon Lee, Suwon-si (KR); Jung Min Choi, Suwon-si (KR); Cheol Hong Park, Seoul (KR); Moohyun Koh, Hwaseong-si (KR); Sang Won Bae, Suwon-si (KR); Jungah Kim, Hwaseong-si (KR)

(73) Assignees: Samsung SDI Co., Ltd., Yongin-si (KR); Samsung Electronics Co., Ltd., Suwon-si (KR)

( * ) Notice: Subject to any disclaimer, the term of this patent is extended or adjusted under 35 U.S.C. 154(b) by 838 days.

(21) Appl. No.: 18/061,859

(22) Filed: Dec. 5, 2022

(65) Prior Publication Data

US 2023/0288799 A1 Sep. 14, 2023

(30) Foreign Application Priority Data

Jan. 24, 2022 (KR) ........................ 10-2022-0010128

(51) Int. Cl.
*G03F 7/004* (2006.01)
*G03F 7/16* (2006.01)
*G03F 7/32* (2006.01)

(52) U.S. Cl.
CPC ............ *G03F 7/0042* (2013.01); *G03F 7/162* (2013.01); *G03F 7/168* (2013.01); *G03F 7/325* (2013.01)

(58) Field of Classification Search
None
See application file for complete search history.

(56) References Cited

U.S. PATENT DOCUMENTS

| | | | |
|---|---|---|---|
| 2004/0170931 A1 | 9/2004 | Suzuki | |
| 2005/0176607 A1 | 8/2005 | Ahn et al. | |
| 2005/0282093 A1 | 12/2005 | Dammel et al. | |
| 2007/0010409 A1* | 1/2007 | Zhang | G03F 7/322 510/123 |
| 2008/0214422 A1* | 9/2008 | Ahn | C11D 7/266 510/176 |
| 2018/0046086 A1 | 2/2018 | Waller et al. | |
| 2018/0147599 A1* | 5/2018 | Tanaka | B05D 1/36 |
| 2020/0041897 A1* | 2/2020 | Moon | G03F 7/0048 |
| 2020/0326631 A1 | 10/2020 | Kumagai et al. | |
| 2021/0134589 A1 | 5/2021 | Weng et al. | |
| 2021/0364916 A1 | 11/2021 | Yang et al. | |
| 2022/0059345 A1* | 2/2022 | Koh | G03F 7/40 |
| 2022/0404710 A1 | 12/2022 | Choi et al. | |
| 2023/0183866 A1* | 6/2023 | Sugawara | C23G 1/10 510/407 |

FOREIGN PATENT DOCUMENTS

| | | | |
|---|---|---|---|
| JP | S59142547 | A | 8/1984 |
| JP | 2004-239986 | A | 8/2004 |
| JP | 2005-215471 | A | 8/2005 |
| KR | 10-2003-0032825 | A | 4/2003 |
| KR | 10-2007-0032001 | A | 3/2007 |
| KR | 10-0922074 | B1 | 10/2009 |
| KR | 10-2011-0016793 | A | 2/2011 |
| KR | 10-1571711 | B1 | 11/2015 |
| KR | 10-2019-0030231 | A | 3/2019 |
| KR | 10-2020-0025651 | A | 3/2020 |
| KR | 10-2020-0120528 | A | 10/2020 |
| KR | 10-2021-0062762 | A | 6/2021 |

OTHER PUBLICATIONS

Office Action, dated Mar. 13, 2025, of the corresponding Korean Patent Application No. 10-2022-0010128, 7 pages.
Notice of Allowance dated Oct. 10, 2025 of the corresponding Korean Patent Application No. 10-2022-0010128, 3pp.
Chinese Notification of First Office Action, for Patent Application No. 202211535262.9, dated Mar. 1, 2026, 11 pages.

* cited by examiner

*Primary Examiner* — Anca Eoff
(74) *Attorney, Agent, or Firm* — Womble Bond Dickinson (US) LLP

(57) ABSTRACT

A method of forming patterns includes coating a metal-containing resist composition on a substrate, sequentially coating two types of compositions for removing edge beads along an edge of the substrate, performing a heat-treatment including drying and heating to form a metal-containing resist film on the substrate, and exposing and developing the metal-containing resist film to form a resist pattern; or coating a metal-containing resist composition on a substrate, coating a composition for removing edge beads along an edge of the substrate, performing a heat-treatment including drying and heating to form a metal-containing resist film on the substrate, exposing the metal-containing resist film, and developing with a developing solution composition to form a resist pattern, wherein details of the two types of compositions for removing edge beads and the developing solution composition are as described in the specification.

9 Claims, 1 Drawing Sheet

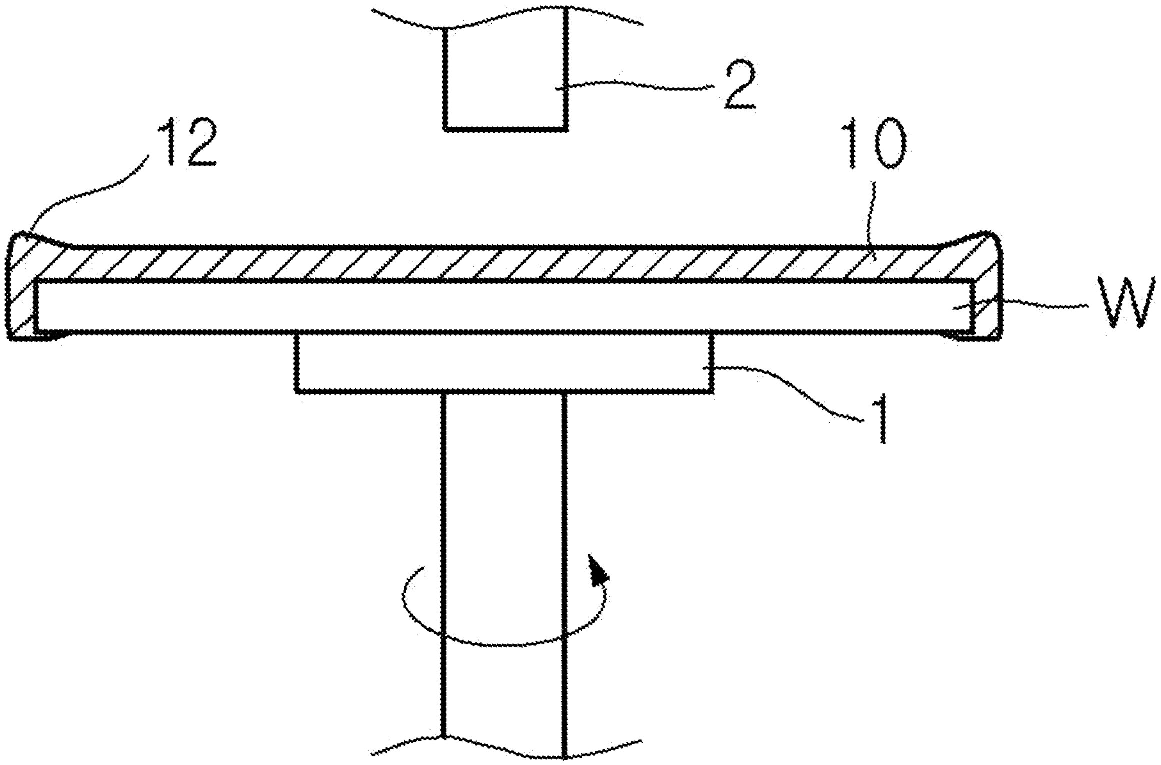
2
12
10
W
1

METHOD OF FORMING PATTERNS

CROSS-REFERENCE TO RELATED APPLICATION

This application claims priority to and the benefit of Korean Patent Application No. 10-2022-0010128 filed in the Korean Intellectual Property Office on Jan. 24, 2022, the entire contents of which are hereby incorporated by reference.

BACKGROUND

1. Field

Embodiments of this disclosure relate to a method of forming patterns including coating a composition for removing edge beads, and a method of forming patterns including coating a composition for removing edge beads and developing, in order to reduce metal contamination occurring along wafer edges.

2. Description of the Related Art

In recent years, a semiconductor industry has been accompanied by a continuous reduction of critical dimensions, and this dimensional reduction requires new types (or kinds) of high-performance photoresist materials and a patterning method that satisfy a demand for processing and patterning with increasingly smaller features.

In addition, with the recent rapid development of the semiconductor industry, a semiconductor device is required to have a fast operation speed and large storage capacity, and in line with this requirement, process technology for improving integration, reliability, and a response speed of the semiconductor device is being developed. For example, it is important to accurately control/implant impurities in working regions of a silicon substrate and to interconnect these regions to form a device and an ultra-high-density integrated circuit, which may be achieved by a photolithographic process. In other words, it is important to integrate the photolithographic process including coating a photoresist on the substrate, selectively exposing it to ultraviolet (UV) light (including extreme ultraviolet (UV) light), electron beams, X rays, and/or the like, and then, developing it.

For example, in the process of forming the photoresist layer, the resist is coated on the substrate, mainly while rotating the silicon substrate, wherein the resist is coated on an edge and rear surface of the substrate, which may cause indentation or pattern defects in the subsequent semiconductor processes such as etching and ion implantation processes. Accordingly, a process of stripping and removing the photoresist coated on the edge and rear surface of the silicon substrate by using a thinner composition, for example, an EBR (edge bead removal) process is performed. The EBR process requires a composition that exhibits excellent solubility for the photoresist and effectively removes beads and the photoresist remaining in the substrate and generates no or substantially no resist residue.

In addition, development of a photoresist and a developer composition capable of ensuring excellent etch resistance and resolution in the photolithographic process and concurrently (e.g., simultaneously), improving sensitivity and CD (critical dimension) uniformity and also, improving LER (line edge roughness) characteristics is required.

SUMMARY

An embodiment of the present disclosure provides a method of forming patterns including coating a composition for removing edge beads.

Another embodiment provides a method of forming patterns including coating a composition for removing edge beads and developing the same.

A method of forming patterns according to an embodiment includes coating a metal-containing resist composition on a substrate; sequentially coating two different compositions for removing edge beads along an edge of the substrate; performing a heat-treatment including drying and heating to form a metal-containing resist film on the substrate; and exposing and developing the metal-containing resist film to form a resist pattern, Wherein the two different compositions for removing edge beads may be independently Composition A including a phosphorous acid-based compound and an organic solvent; or Composition B including a glycol ether or ester thereof, an ester of hydroxy acid or an ester of alkyl ether acid, and an ester of carboxylic acid.

The Composition A may include about 0.01 wt % to about 50 wt % of the phosphorous acid-based compound, and about 50 wt % to about 99.99 wt % of the organic solvent based on 100 wt % of Composition A.

Composition B may include about 30 wt % to about 75 wt % of the glycol ether or ester thereof, about 5 wt % to about 50 wt % of the ester of hydroxy acid or the ester of alkyl ether acid, and about 15 wt % to about 55 wt % of an ester of carboxylic acid based on 100 wt % of Composition B.

The coating of the composition for removing edge beads may include a first process of coating a composition for removing edge beads of any one of Composition A or Composition B along the edge of the substrate while spinning the substrate, and a second process of coating a composition for removing edge beads different from the composition applied in the first process of Composition A or Composition B along the edge of the substrate while spinning the substrate.

After the second process, a third process of coating composition for removing edge beads along the edge of the substrate while spinning the substrate may be further included.

The composition for removing edge beads applied in the third process may be a composition C that may be the same composition as the composition applied in the first process of Composition A or Composition B, or may be different from Composition A and Composition B, and may include an acid additive and an organic solvent.

After the exposing and the developing, the method may further include coating at least one of Composition A or Composition B.

The glycol ether or ester thereof may be one of propylene glycol methyl ether, propylene glycol methyl ether acetate, propylene glycol ethyl ether acetate, or a combination thereof.

The ester of hydroxy acid or ester of alkyl ether acid may be one of ethyl lactate, ethyl-3-ethoxy propionate, or a combination thereof.

The ester of the carboxylic acid may be methyl-2-hydroxy isobutyrate.

A method of forming patterns according to another embodiment includes coating a metal-containing resist composition on a substrate; coating a composition for removing edge beads along an edge of the substrate; performing a heat treatment including drying and heating to form a metal-containing resist film on the substrate; exposing the metal-containing resist film; and developing with a developing solution composition including a phosphorous acid-based compound and an organic solvent to form a resist pattern.

The developing solution composition may include about 0.01 wt % to about 50 wt % of the phosphorous acid-based compound and about 50 wt % to about 99.99 wt % of the organic solvent based on 100 wt % of the developing solution composition.

The phosphorous acid-based compound may be at least one type (or kind) of phosphonic acid, methyl phosphonic acid, ethyl phosphonic acid, butyl phosphonic acid, hexyl phosphonic acid, n-octyl phosphonic acid, tetradecyl phosphonic acid, octadecyl phosphonic acid, phenyl phosphonic acid, vinyl phosphonic acid, aminomethyl phosphonic acid, methylenediamine tetramethylene phosphonic acid, ethylenediamine tetramethylene phosphonic acid, 1-amino 1-phosphonooctyl phosphonic acid, etidronic acid, 2-aminoethyl phosphonic acid, 3-aminopropyl phosphonic acid, 6-hydroxyhexyl phosphonic acid, decyl phosphonic acid, methylene diphosphonic acid, nitrilotrimethylene triphosphonic acid, 1H, 1H,2H,2H-perfluorooctanephosphonic acid, or a combination thereof.

The metal-containing resist composition may include a metal compound including at least one of an alkyl tin oxo group or an alkyl tin carboxyl group.

The metal compound may be represented by Chemical Formula 1.

[Chemical Formula 1]

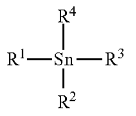

In Chemical Formula 1, $R^1$ is one of a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C6 or C30 arylalkyl group, or $—R^a—O—R^b$ (wherein $R^a$ is a substituted or unsubstituted C1 to C20 alkylene group, and $R^b$ is a substituted or unsubstituted C1 to C20 alkyl group), $R^2$ to $R^4$ are each independently $—OR^c$ or $—OC(=O)R^d$, $R^c$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^d$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

The method of forming patterns according to an embodiment may meet the demands for processing and patterning with smaller features by removing the metal-containing resist coated on the edge and rear surface of the substrate and thus reducing metal-based contaminations.

A method of forming patterns according to another embodiment may realize excellent contrast characteristics by minimizing or reducing defects present in the metal-containing resist film and facilitating development after an exposure process.

BRIEF DESCRIPTION OF THE DRAWINGS

The accompanying drawing, together with the specification, illustrates embodiments of the subject matter of the present disclosure, and, together with the description, serves to explain principles of embodiments of the subject matter of the present disclosure.

The accompanying drawing is a schematic view showing the photoresist coating apparatus.

DETAILED DESCRIPTION

Hereinafter, referring to the drawing, embodiments of the present disclosure are described in more detail. In the following description of the subject matter of the present disclosure, the well-known functions or constructions will not be described in order to clearly describe the subject matter of the present disclosure.

In order to clearly illustrate the subject matter of the present disclosure, some description and/or relationships may be omitted, and throughout the disclosure, the same or similar configuration elements are designated by the same reference numerals. Also, because the size and thickness of each configuration shown in the drawing may be arbitrarily shown for better understanding and ease of description, the subject matter of the present disclosure is not necessarily limited thereto.

In the drawing, the thickness of layers, films, panels, regions, etc., may be exaggerated for clarity. In the drawings, the thickness of a part of layers or regions, etc., may be exaggerated for clarity. It will be understood that when an element such as a layer, film, region, or substrate is referred to as being "on" another element, it can be directly on the other element or intervening elements may also be present.

The accompanying drawing is a schematic view showing the photoresist coating apparatus.

Referring to the accompanying drawing, a substrate support portion 1 on which a substrate W is placed is equipped therewith, and the substrate support portion 1 includes a spin chuck and/or a spin coater.

The substrate support portion 1 rotates in a first direction at a set or predetermined rotation speed to provide a centrifugal force to the substrate W. A spray nozzle 2 may be positioned on the substrate support portion 1 but located off (e.g., not in physical contact with) an upper portion of the substrate W in the atmospheric region so that the spray nozzle 2 may be moved toward the upper portion of the substrate W and spray a photoresist solution 10 in the spraying step. Accordingly, the photoresist solution 10 is coated on a surface of the substrate W by centrifugal force (inertial force). Herein, the photoresist solution 10 supplied to a center of the substrate W is coated while spreading to the edge of the substrate W by the centrifugal force, wherein a portion of the photoresist solution 10 moves to side surfaces of the substrate W and a lower surface of the edge of the substrate.

In other words, in the coating process, the photoresist solution 10 is coated mainly in a spin coating method, wherein a set or predetermined amount of the photoresist solution 10 having a set or predetermined viscosity is supplied to the center portion of the substrate W and gradually spreads toward the edge of the substrate W by the centrifugal force (inertial force).

Accordingly, the photoresist film is evenly or substantially evenly formed by a rotational speed of the substrate support portion.

On the other hand, this rotation evaporates a solvent from the solution (the photoresist solution 10) and thereby gradually increases the viscosity of the photoresist solution 10, resulting in a relatively large amount of the photoresist accumulating on the edge of the substrate by action of surface tension and severely even onto the lower surface of the edge of the substrate, which is referred to as edge beads 12 shown in the accompanying drawing.

Hereinafter, a method of forming patterns according to an embodiment is described.

A method of forming patterns according to an embodiment includes coating a metal-containing resist composition on a substrate, sequentially coating two types (or kinds) of compositions for removing edge beads (e.g., at least two compositions that are different from each other) along the edges of the substrate, performing heat-treatment including drying and heating to form a metal-containing resist film on the substrate, and exposing and developing the metal-containing resist film to form a resist pattern.

A method of forming patterns according to another embodiment includes coating a metal-containing resist composition on a substrate, coating a composition for removing edge beads along an edge of the substrate, performing heat-treatment including drying and heating to form a metal-containing resist film on the substrate, exposing the metal-containing resist film; and developing with a developing solution composition including a phosphorous acid-based compound and an organic solvent to form a resist pattern.

In some embodiments, the forming of the pattern by using the metal-containing resist composition may include coating the metal-containing resist composition on the substrate on which a thin film is formed in a method of spin coating, slit coating, inkjet printing, and/or the like and drying it to form a resist film. The metal-containing resist composition may include a metal compound. In some embodiments, the metal compound may include a tin-based compound, and the tin-based compound may include, for example, at least one of an alkyl tin oxo group or an alkyl tin carboxyl group.

For example, the metal compound included in the metal-containing resist composition may be represented by Chemical Formula 1.

[Chemical Formula 1]

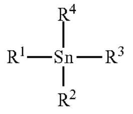

In Chemical Formula 1, $R^1$ is one of a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, a substituted or unsubstituted C6 or C30 arylalkyl group, and $-R^a-O-R^b$ (wherein $R^a$ is a substituted or unsubstituted C1 to C20 alkylene group and $R^b$ is a substituted or unsubstituted C1 to C20 alkyl group), $R^2$ to $R^4$ are each independently $-OR^c$ or $-OC(=O)R^d$, $R^c$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, and $R^d$ is hydrogen, a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof.

Subsequently, coating a composition for removing edge beads may be performed.

In the present disclosure, embodiments of the method may include sequentially coating two types of compositions (e.g., at least two compositions that are different from each other) for removing edge beads along the edges of the substrate.

In an embodiment, the two types of compositions for removing edge beads may be each independently Composition A including a phosphorous acid-based compound and an organic solvent; or Composition B including a glycol ether or ester thereof, an ester of hydroxy acid or an ester of alkyl ether acid, and an ester of carboxylic acid.

Composition A may include about 0.01 wt % to about 50 wt % of the phosphorous acid-based compound and about 50 wt % to about 99.99 wt % of the organic solvent based on 100 wt % of Composition A.

In an embodiment, Composition A may include the phosphorous acid-based compound in an amount of about 0.1 wt % to about 40 wt %, for example, about 0.5 wt % to about 30 wt %, or about 1 wt % to about 20 wt % based on 100 wt % of Composition A.

An example of the organic solvent included in Composition A according to an embodiment may include for example propylene glycol methyl ether (PGME), propylene glycol methyl ether acetate (PGMEA), propylene glycol butyl ether (PGBE), ethylene glycol methyl ether, diethylglycolethylmethylether, dipropylglycoldimethylether, ethanol, 2-butoxyethanol, n-propanol, isopropanol, n-butanol, isobutanol, hexanol, ethylene glycol, propylene glycol, heptanone, propylene carbonate, butylene carbonate, diethyl ether, diisopropyl ether, dibutyl ether, ethyl acetate, ethyl lactate, methyl-2-hydroxy-isobutyrate, gamma-butyrolactone, methyl 3-methoxypropionate, ethyl 3-ethoxypropionate, methyl isobutyl carbinol (MIBC), n-butyl acetate, diisopentyl ether, xylene, acetone, methylethylketone, methylisobutylketone, tetrahydrofuran, dimethylsulfoxide, dimethyl formamide, acetonitrile, acetylacetone, diacetone alcohol, 3,3-dimethyl-2-butanone, N-methyl-2-pyrrolidone, dimethyl acetamide, cyclohexanone, or a mixture thereof, but is not limited thereto.

For example, the phosphorous acid-based compound may be at least one type (or kind) of phosphonic acid, methyl phosphonic acid, ethyl phosphonic acid, butyl phosphonic acid, hexyl phosphonic acid, n-octyl phosphonic acid, tetradecyl phosphonic acid, octadecyl phosphonic acid, phenyl phosphonic acid, vinyl phosphonic acid, aminomethyl phosphonic acid, methylenediamine tetramethylene phosphonic acid, ethylenediamine tetramethylene phosphonic acid, 1-amino 1-phosphonooctyl phosphonic acid, etidronic acid, 2-aminoethyl phosphonic acid, 3-aminopropyl phosphonic acid, 6-hydroxyhexyl phosphonic acid, decyl phosphonic acid, methylene diphosphonic acid, nitrilotrimethylene triphosphonic acid, 1H,1H,2H,2H-perfluorooctanephosphonic acid, or a combination thereof.

Composition B may include about 30 wt % to about 75 wt % of the glycol ether or ester thereof, about 5 wt % to about 50 wt % of the ester of hydroxy acid or the ester of alkyl ether acid, and about 15 wt % to about 55 wt % of the ester of carboxylic acid based on 100 wt % of Composition B.

In some embodiments, Composition B may include the glycol ether or ester thereof in an amount of about 35 wt % to about 70 wt %, for example, about 40 wt % to about 65 wt %, or about 45 wt % to about 60 wt % based on 100 wt % of Composition B.

In some embodiments, Composition B may include the ester of hydroxy acid or ester of alkyl ether acid in an amount of about 5 wt % to about 45 wt %, for example, about 5 wt % to about 40 wt %, or about 10 wt % to about 40 wt % based on 100 wt % of Composition B.

In some embodiments, Composition B may include the ester of the carboxylic acid in an amount of about 15 wt % to about 50 wt %, for example, about 20 wt % to about 45 wt %, or about 25 wt % to about 40 wt % based on 100 wt % of Composition B.

For example, the glycol ether or ester thereof may be one type (or kind) of propylene glycol methyl ether, propylene glycol methyl ether acetate, propylene glycol ethyl ether acetate, or a combination thereof.

For example, the ester of hydroxy acid or ester of alkyl ether acid may be one type (or kind) of ethyl lactate, ethyl-3-ethoxy propionate, or a combination thereof.

For example, the ester of the carboxylic acid may be methyl-2-hydroxy isobutyrate.

The method of forming patterns including the edge bead removal according to embodiments the present disclosure may be particularly effective for removing the metal-containing resist film and, for example, removing undesirable metal residues such as, for example, tin-based metal residues.

In embodiments of the present disclosure, the coating of the composition for removing edge beads may be repetitively performed several times to reduce metal-based contamination coated on the edge and rear surface of the substrate and also, to reduce the resist to a suitable or desired level.

For example, at least two types of compositions for removing edge beads (e.g., at least two compositions that are different from each other) may be applied. In addition, the same composition for removing edge beads may be applied several times.

In some embodiments, when at least two types of compositions for removing edge beads (e.g., at least two compositions that are different from each other) are applied, coating of the compositions may be performed sequentially.

For example, any one type (or kind) of the compositions for removing edge beads is coated, and subsequently, the other type (or kind) of the compositions for removing edge beads may be coated.

For example, the coating of the composition for removing edge beads may include a step 1 of coating a suitable or appropriate amount of either one of Composition A or Composition B as the composition for removing edge beads along the edge of the substrate at a suitable or appropriate speed (e.g., about 500 rpm or higher, specifically about 500 rpm or higher and about 3,000 rpm or lower), while rotating the substrate, and a step 2 of coating a suitable or appropriate amount of the other composition for removing edge beads which is different from the composition coated in the step 1 at a suitable or appropriate speed (e.g., about 500 rpm or higher, specifically about 500 rpm or higher and about 3,000 rpm or lower) out of the compositions A and B.

After the step 2, a step 3 of coating a composition for removing edge beads at a suitable or appropriate speed (e.g., about 500 rpm or higher, specifically about 500 rpm or higher and about 3,000 rpm or lower), while rotating the substrate, may be further included.

For example, in the step 3, the same composition for removing edge beads as the composition applied in the step 1 out of the compositions A and B may be coated in a suitable or appropriate amount.

For another example, in the step 3, a composition C including an acid additive and an organic solvent as a composition for removing edge beads which is different from Composition A and Composition B may be coated in a suitable or appropriate amount.

The acid additive and the organic solvent included in the composition C may be any suitable material generally used in the art that is applicable to the composition for removing edge beads in the art without limitation.

Subsequently, a first heat treatment process of heating the substrate on which the photoresist film is formed may be performed. The first heat treatment process may be performed at about 80° C. to about 160° C., which may evaporate the solvent and adhere the photoresist film more firmly to the substrate.

Then, an exposure process of selectively exposing the photoresist film may be performed.

Examples of light used in the exposure process may not only include light having a short wavelength such as, for example, i-line light (wavelength: 365 nm), KrF excimer laser light (wavelength: 248 nm), ArF excimer laser light (wavelength: 193 nm), and/or the like but also light having a high energy wavelength such as, for example, EUV light (Extreme Ultra Violet light; wavelength: 13.5 nm), E-Beam (electron beam), and/or the like.

In some embodiments, the light for the exposure process according to an embodiment may be light having a short wavelength from about 5 nm to about 150 nm but also light having a high energy wavelength such as EUV light (Extreme UltraViolet light; wavelength: about 13.5 nm), E-Beam (electron beam), and/or the like.

In the forming the photoresist pattern, a negative pattern may be formed.

The exposed region of the photoresist film has different solubility from that the unexposed region of the photoresist film, as a polymer is formed by a cross-linking reaction such as condensation between organometallic compounds.

Subsequently, the substrate may be secondarily heat-treated by a second heat treatment process. The second heat treatment process may be performed at a temperature from about 90° C. to about 200° C. The second heat treatment process may make the exposed region of the photoresist film less dissolved in the developing solution composition.

Subsequently, the developing with the developing solution composition may be performed (e.g., a development process may be performed).

In some embodiments, the photoresist film corresponding to the unexposed region is dissolved and removed by using the developing solution composition to complete a photoresist pattern corresponding to the negative tone image.

The developing solution composition used in embodiments of the method of forming patterns may include for example an organic solvent, for example, ketones such as methylethylketone, acetone, cyclohexanone, 2-heptone, and/or the like, alcohols such as 4-methyl-2-propanol, 1-butanol, isopropanol, 1-propanol, methanol, propylene glycol methyl ether (PGME), methyl isobutyl carbinol (MIBC), and/or the like, esters such as propylene glycol methyl ether acetate, ethyl acetate, ethyl lactate, n-butyl acetate, methyl-2-hydroxy isobutyrate, butyrolactone, and/or the like, aromatic compounds such as benzene, xylene, toluene, and/or the like, or a combination thereof.

The developing solution composition according to an embodiment of the present disclosure may include a phosphorous acid-based compound and an organic solvent and may be, for example, the aforementioned composition A.

The developing solution composition may include about 0.01 wt % to about 50 wt % of the phosphorous acid-based compound and about 50 wt % to about 99.99 wt % of the organic solvent based on 100 wt % of the developing solution composition.

In some embodiments the developing solution composition may include the phosphorous acid-based compound in an amount of about 0.1 wt % to about 40 wt %, for example, about 0.5 wt % to about 30 wt %, or about 1 wt % to about 20 wt % based on 100 wt % of the developing solution composition.

Examples of the phosphorous acid-based compound and the organic solvent included in the developing solution composition are the same as described above for the composition A.

After the exposure process and the development process, a process of coating at least one composition out of Composition A and Composition B may be additionally performed to minimize or reduce a content of residual metal possibly present in the edge of the substrate.

As described above, the photoresist pattern formed through the exposure process by light having high energy such as, for example, EUV light (Extreme Ultra Violet; wavelength: about 13.5 nm), E-Beam (electron beam), and/or the like as well as light having a wavelength such as, for example, i-line light (wavelength: about 365 nm), KrF excimer laser light (wavelength: about 248 nm), ArF excimer laser light (wavelength: about 193 nm), and/or the like may have a width from about 5 nm to about 100 nm. For example, the photoresist pattern may have a width ranging from about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm.

On the other hand, the photoresist pattern may have a half-pitch having a line width roughness of less than or equal to about 50 nm, for example, less than or equal to about 40 nm, for example, less than or equal to about 30 nm, for example, less than or equal to about 20 nm, or, for example, less than or equal to about 15 nm and a pitch of less than or equal to about 10 nm, less than or equal to about 5 nm, less than or equal to about 3 nm, or less than or equal to about 2 nm.

Hereinafter, embodiments of the present disclosure will be described in more detail through examples relating to the preparation of the composition for removing edge beads of the aforementioned metal-containing resist composition, the metal-containing resist film, and/or the developing solution composition. However, the technical features of the present disclosure are not limited by the following examples.

Preparation Examples 1 to 6: Preparation of Composition A

A phosphorous acid-based compound was mixed together with an organic solvent to have each composition shown in Table 1 and then, completely dissolved therein by shaking at room temperature (25° C.). Subsequently, the solution was passed through a filter having a 1 μm pore size and formed of a PTFE material, obtaining Composition A.

TABLE 1

| | Composition A | |
|---|---|---|
| | Phosphorous acid-based compound (wt %) | Organic solvent (wt %) [mixing ratio (w/w)] |
| Preparation Example 1 | phenyl phosphonic acid (1) | MIBC (99) |
| Preparation Example 2 | phosphonic acid (1) | PGMEA/PGME (99) [7:3] |
| Preparation Example 3 | vinyl phosphonic acid (1) | PGMEA (99) |
| Preparation Example 4 | phenyl phosphonic acid (0.1) | PGMEA (99.9) |
| Preparation Example 5 | chloromethyl phosphonic acid (1) | PGMEA/PGME (99) [6:4] |
| Preparation Example 6 | 2-chloroethyl phosphonic acid (1) | PGMEA/PGME (99) [5:5] |

Preparation Example 7: Preparation of Composition B 50 wt % of propylene glycol methyl ether acetate (PGMEA), 10 wt % of ethyl lactate, and 40 wt % of methyl-2-hydroxy isobutyrate were mixed together and completely dissolved by shaking at room temperature (25° C.). Subsequently, the solution was passed through a filter having a 1 μm pore size and formed of a PTFE material, obtaining Composition B.

Preparation Example 8: Preparation of Composition C 10 wt % of a glycolic acid compound and 90 wt % of PGMEA/PGME were mixed together [a mixing ratio=5:5] and then, completely dissolved by shaking at room temperature (25° C.). Subsequently, the solution was passed through a filter having a 1 μm pore size and formed of a PTFE material, obtaining a composition.

Preparation Example 9: Preparation of Organometal-Containing Photoresist Composition An organometallic compound having a structure of Chemical Formula C was dissolved at a concentration of 1 wt % in 4-methyl-2-pentanol and then, filtered through a 0.1 μm PTFE syringe filter, obtaining a photoresist composition.

[Chemical Formula C]

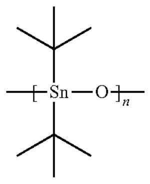

Evaluation 1: Residual Tin (Sn) Content 1.0 mL of the organometal-containing photoresist composition according to Preparation Example 9 was cast on a 4-inch silicon wafer, allowed to stand for 20 seconds, and then, spin-coated at 1,500 rpm for 30 seconds. 6.5 mL of respective ones of the compositions for removing edge beads according to Preparation Examples 1 to 8 were respectively put along an edge of the wafer in order as shown in Table 2, while rotating the wafer together with a resist film at 800 rpm, and then, spin-coated for 3 seconds and dried while rotating the wafer at 1,500 rpm for 25 seconds. Then, a VPD ICP-MS analysis was performed to check an Sn content.

TABLE 2

| | Coating of composition for removing edge beads | | | Residual Sn content ($\times 10^{10}$ atoms/$cm^2$) |
|---|---|---|---|---|
| | First step | Second step | Third step | |
| Example 1 | Preparation Example 7 | Preparation Example 1 | — | 31 |
| Example 2 | Preparation Example 1 | Preparation Example 7 | — | 34 |
| Example 3 | Preparation Example 7 | Preparation Example 1 | Preparation Example 8 | 11 |
| Example 4 | Preparation Example 7 | Preparation Example 2 | — | 83 |
| Example 5 | Preparation Example 2 | Preparation Example 7 | — | 55 |
| Example 6 | Preparation Example 7 | Preparation Example 2 | Preparation Example 8 | 13 |
| Example 7 | Preparation Example 7 | Preparation Example 3 | — | 67 |
| Example 8 | Preparation Example 3 | Preparation Example 7 | — | 90 |
| Example 9 | Preparation Example 7 | Preparation Example 3 | Preparation Example 8 | 26 |
| Example 10 | Preparation Example 7 | Preparation Example 4 | — | 72 |
| Example 11 | Preparation Example 4 | Preparation Example 8 | — | 49 |
| Example 12 | Preparation Example 7 | Preparation Example 4 | Preparation Example 8 | 14 |
| Comparative Example 1 | Preparation Example 5 | — | — | 380 |
| Comparative Example 2 | Preparation Example 6 | — | — | 490 |
| Comparative Example 3 | Preparation Example 8 | — | — | 5300 |
| Comparative Example 4 | Preparation Example 7 | Preparation Example 8 | — | 1350 |
| Comparative Example 5 | Preparation Example 8 | Preparation Example 7 | — | 1600 |
| Comparative Example 6 | Preparation Example 7 | Preparation Example 8 | Preparation Example 7 | 960 |

Referring to Table 1, a method of forming patterns including coating the compositions for removing edge beads according to Examples 1 to 12, compared with a method of forming patterns including coating the compositions for removing edge beads according to Comparative Examples 1 to 6, turned out to have excellent metal removal effects, thereby further promoting reduction of residual metal.

Evaluation 2: Contrast Performance

The prepared organometal-containing photoresist (PR) composition was spin-coated on an 8 inch wafer at 1,500 rpm for 30 seconds and then, heat-treated at 100° C. for 60 seconds, preparing a coated wafer.

The coated wafer was exposed to light having an energy of 20 mJ to 60 mJ to have a 1.2 cm×0.9 cm-sized rectangular shape pattern by using a KrF scanner (PAS 5500/700D, ASML), heat-treated at 180° C. for 60 seconds, and developed by coating Composition A according to the preparation example as a developing solution composition, and finally, heat-treated at 150° C. for 60 seconds, completing a patterned wafer.

The patterned wafer was measured with respect to a thickness of each exposed region to obtain a contrast curve, which was used to calculate contrast performance (γ(contrast)), and the results are shown in Table 3.

TABLE 3

| | Developing solution | γ(contrast) |
|---|---|---|
| Example 13 | Preparation Example 2 | 37 |
| Example 14 | Preparation Example 3 | 44 |
| Example 15 | Preparation Example 4 | 40 |
| Comparative Example 7 | Preparation Example 7 | 22 |
| Comparative Example 8 | Preparation Example 8 | 25 |

Referring to Table 3, when Composition A including a phosphorous acid-based compound was applied as a developing solution of an organometal-containing photoresist film, compared with when Composition A was not applied, excellent contrast performance was accomplished.

Hereinbefore, certain embodiments of the present disclosure have been described and illustrated, however, it should be apparent to a person having ordinary skill in the art that subject matter of the present disclosure is not limited to particular embodiments as described, and may be variously modified and transformed without departing from the spirit and scope of the present disclosure. Accordingly, the modified or transformed embodiments as such may not be understood separately from the technical ideas and aspects of the present disclosure, and the modified embodiments are within the scope of the claims of the present disclosure, and equivalents thereof.

DESCRIPTION OF SYMBOLS

1: substrate support portion 2: spray nozzle
10: photoresist a solution 12: edge bead

What is claimed is:

1. A method of forming patterns, comprising:

coating a metal-containing resist composition on a substrate;

sequentially coating two different compositions for removing edge beads along an edge of the substrate;

performing a heat-treatment comprising drying and heating to form a metal-containing resist film on the substrate; and exposing and developing the metal-containing resist film to form a resist pattern, wherein the two different compositions for removing edge beads each independently comprise:

Composition A comprising a phosphorous acid-based compound and an organic solvent; or Composition B comprising a glycol ether or ester thereof, an ester of hydroxy acid or an ester of alkyl ether acid, and an ester of carboxylic acid, wherein at least one of the two different compositions for removing edge beads comprises Composition A, wherein Composition A does not include ethylenediamine tetramethylene phosphonic acid, and wherein the phosphorous acid-based compound is at least one of phosphonic acid, methyl phosphonic acid, ethyl phosphonic acid, butyl phosphonic acid, hexyl phosphonic acid, n-octyl phosphonic acid, tetradecyl phosphonic acid, octadecyl phosphonic acid, phenyl phosphonic acid, vinyl phosphonic acid, aminomethyl phosphonic acid, methylenediamine tetramethylene phosphonic acid, 1-amino 1-phosphonooctyl phosphonic acid, etidronic acid, 2-aminoethyl phosphonic acid, 3-aminopropyl phosphonic acid, 6-hydroxyhexyl phosphonic acid, decyl phosphonic acid, methylene diphosphonic acid, nitrilotrimethylene triphosphonic acid, 1H, 1H,2H,2H-perfluorooctanephosphonic acid, or a combination thereof.

2. The method of claim 1, wherein:

Composition A comprises 0.01 wt % to 50 wt % of the phosphorous acid-based compound, and 50 wt % to 99.99 wt % of the organic solvent based on 100 wt % of Composition A.

3. The method of claim 1, wherein:

Composition B comprises 30 wt % to 75 wt % of the glycol ether or ester thereof, 5 wt % to 50 wt % of the ester of hydroxy acid or the ester of alkyl ether acid, and 15 wt % to 55 wt % of the ester of carboxylic acid based on 100 wt % of Composition B.

4. The method of claim 1, wherein:

the sequentially coating of the two different compositions for removing edge beads comprises:

a first process of coating a composition for removing edge beads of any one of Composition A or Composition B along the edge of the substrate while spinning the substrate, and a second process of coating a composition for removing edge beads that is different from the composition applied in the first process of Composition A and Composition B along the edge of the substrate while spinning the substrate.

5. The method of claim 4, wherein:

after the second process, a third process of coating a composition for removing edge beads substrate that is the same composition as the composition applied in the first process of Composition A or Composition B, or is different from Composition A and Composition B along the edge of the substrate while spinning the substrate.

6. The method of claim 1, wherein:

after the exposing and the developing, the method further comprises coating at least one of Composition A or Composition B.

7. The method of claim 1, wherein:

the glycol ether or ester thereof is one of propylene glycol methyl ether, propylene glycol methyl ether acetate, propylene glycol ethyl ether acetate, or a combination thereof, the ester of hydroxy acid or ester of alkyl ether acid is one of ethyl lactate, ethyl-3-ethoxy propionate, or a combination thereof, and an ester of carboxylic acid is methyl-2-hydroxy isobutyrate.

8. The method of claim 1, wherein:

the metal-containing resist composition comprises a metal compound comprising at least one of an alkyl tin oxo group or an alkyl tin carboxyl group.

9. A method of forming patterns, comprising:

coating a metal-containing resist composition on a substrate;

sequentially coating two different compositions for removing edge beads along an edge of the substrate;

performing a heat-treatment comprising drying and heating to form a metal-containing resist film on the substrate; and exposing and developing the metal-containing resist film to form a resist pattern, wherein the two different compositions for removing edge beads each independently comprise:

Composition A comprising a phosphorous acid-based compound and an organic solvent; or Composition B comprising a glycol ether or ester thereof, an ester of hydroxy acid or an ester of alkyl ether acid, and an ester of carboxylic acid, wherein:

the sequentially coating of the two different compositions for removing edge beads comprises:

a first process of coating a composition for removing edge beads of any one of Composition A or Composition B along the edge of the substrate while spinning the substrate, and a second process of coating a composition for removing edge beads that is different from the composition applied in the first process of Composition A and Composition B along the edge of the substrate while spinning the substrate, wherein:

after the second process, a third process of coating a composition for removing edge beads substrate that is the same composition as the composition applied in the first process of Composition A or Composition B, or is different from Composition A and Composition B along the edge of the substrate while spinning the substrate, and wherein:

the composition for removing edge beads that is different from Composition A or Composition B comprises an acid additive and an organic solvent.

* * * * *